United States Patent [19]

Proebsting

[11] 3,775,693

[45] Nov. 27, 1973

[54] MOSFET LOGIC INVERTER FOR INTEGRATED CIRCUITS

[75] Inventor: Robert J. Proebsting, Richardson, Tex.

[73] Assignee: Moskek Company, Carrolton, Tex.

[22] Filed: Nov. 29, 1971

[21] Appl. No.: 202,953

[52] U.S. Cl. .................... 330/35, 307/205, 307/214, 307/215, 307/218, 307/304

[51] Int. Cl. .................... H03f 3/16

[58] Field of Search .................... 330/35; 307/205, 307/214, 215, 217, 218, 304

[56] References Cited

UNITED STATES PATENTS 3,436,621 4/1969 Crawford .................... 307/304 X

OTHER PUBLICATIONS

Lohman, "Applications of Mosfet's in Microelectronics," Solid State Technology, March 1966, pp. 23–29.

Sonoda, "Mosfet Powering Circuit," IBM Technical Disclosure Bulletin, Vol. 13, No. 9, Feb. 1971, p. 2658.

Scott, "Getting to Know Low-Cost IC's," Radio-Electronics, March 1967, pp. 44–46.

*Primary Examiner*—Roy Lake
*Assistant Examiner*—James B. Mullins
*Attorney*—D. Carl Richards et al.

[57] ABSTRACT

The specification discloses a logic inverter comprised of a depletion mode MOSFET used as a resistive load between a drain supply voltage and an output and one or more enhancement mode MOSFET's connected between output and source supply voltage. The source and gate of the depletion mode device are electrically common, and the gates of the enhancement mode devices form the logic inputs. The use of one enhancement mode device provides a simple inverter, a plurality of enhancement mode devices in parallel form a NOR gate, and a plurality of enhancement mode devices in series form a NAND gate. Combination NOR and NAND GATES may also be formed. The basic inverter circuit is also combined with a push-pull output stage to provide increased speed of operation, particularly at higher drain supply voltages. Still another embodiment utilizes an enhancement mode transistor connected between the depletion mode transistor and the output of the basic inverter stage to provide a disable function in which output drain current is switched off under all logic input conditions.

6 Claims, 10 Drawing Figures

MOSFET LOGIC INVERTER FOR INTEGRATED CIRCUITS

The present invention relates to logic switching circuitry which employs MOSFET devices, and in particular relates to an improved inverter stage for inverting logic gates in integrated circuits.

Digital data processing systems have been fabricated as large-scale integrated (LSI) circuits using metal-oxide-semiconductor field effect transistor (MOSFET) technology for some time. This type of LSI device has, for various processing reasons, generally utilized p-channel enhancement mode devices, although n-channel enhancement mode transistors have certain inherent advantages.

One of the major disadvantages heretofore associated with MOSFET circuits has been the relatively large number of supply voltages, and the relatively high magnitude of the supply voltages required to operate the circuit efficiently. The higher number of supply voltages increases the complexity of the external circuitry associated with the MOS integrated chips, and also increases the number of pins required to interface the integrated circuit package with the external circuitry. The higher voltage results in greater power dissipation and requires larger geometries to provide the necessary voltage breakdown characteristics.

One of the fundamental circuits required in a MOSFET integrated circuit is a simple inverter in which a resistive type load interconnects the drain voltage to the inverter output and an enhancement mode transistor connects the output to the source voltage. When the enhancement mode transistor is switched off, the output is at the drain voltage, which is typically referred to as the logic "1" level. When the enhancement mode transistor is switched on, the output is pulled down to a level near the source voltage, which is typically referred to as the logic "0" level. The logic "0" level depends on the relative resistance of the enhancement mode transistor to that of the resistive type load. Although the use of a simple resistor as the load has the advantage that one of the output levels is the drain supply voltage, the circuit is not practical in integrated circuit form because a diffused region having a resistance sufficiently large to provide a low level of power dissipation occupies a prohibitively large area.

One substitute for a diffused load resistor is an enhancement mode transistor in which the gate is connected to the drain supply voltage. However, this circuit has the disadvantage that the logic "1" level of the output can reach a potential equal only to the drain voltage $V_{DD}$ less the threshold voltage $V_T$ of the load transistor, which is typically several volts. Another disadvantage is that the output current of the load device decreases very rapidly as the magnitude of the voltage on the output, which is the source of the load transistor, increases.

These objections to the use of an enhancement mode transistor as a load can be remedied by applying a voltage $V_{GG}$ to the gate of the transistor of greater magnitude than the drain voltage, but this requires an additional supply voltage. In addition, such a circuit exhibits undesirable nonlinearity in the output current of the inverter stage becuase as the output voltage approaches drain voltage, both the source to drain voltage and the source to gate voltage of the load transistor decrease.

The logic "1" level at the output of the inverter can be raised to $V_{DD}$ without the use of a higher gate voltage $V_{GG}$ by means of a so-called bootstrap inverter. However, the bootstrap circuits require additional devices and have other disadvantages.

Still another circuit which has been used is the complimentary inverter having an n-channel enhancement mode transistor connected to the negative voltage supply and a p-channel enhancement mode transistor connected to the positive voltage supply, with the common drains being the output. The gates of the transistors are connected together and receive the input signal. When the input signal is negative, the n-channel enhancement mode device is turned off, the p-channel enhancement mode device is turned on, and the output is at the level of the positive supply voltage. When the input signal is positive, the n-channel device is on, the p-channel device is off, and the output is at the level of the negative supply voltage. Such a complementary inverter provides good switching characteristics and requires only one supply voltage. However, the use of both n-channel and p-channel devices requires an unusually large amount of area on an integrated circuit chip, and also requires several additional processing steps which significantly increases the cost of the circuit.

The inverter circuit of the present invention is comprised of a depletion mode MOS transistor connecting the drain supply voltage $V_{DD}$ to the output with the gate of the transistor being electrically common with the output. At least one enhancement mode MOS transistor having the same type channel as the depletion mode device provides a path connecting the output to a source voltage supply $V_{SS}$. The gate or gates of the enhancement mode device forms the input for the inverter circuit. The inverter circuit is useful for both p-channel and n-channel integrated circuits, and has the advantages of providing an output logic "1" level when the enhancement mode device is switched off that is substantially equal to the drain supply voltage, thus requiring only one voltage supply. Perhaps more importantly, the current through the depletion mode device remains substantially constant as the output voltage transitions toward the drain supply voltage, thus providing significantly greater switching speeds. The depletion mode device can also be made significantly smaller than an enhancement mode device used for the same purpose, particularly where additional switching speed is not required.

In accordance with another aspect of the invention, the performance of the inverter circuit is enhanced by providing a push-pull output stage comprised of a pair of transistors connected in series between the drain and source voltages. The transistor connected to the source voltage is an enhancement mode device, and the transistor connected to the drain voltage is preferably a depletion mode device, but may also be an enhancement mode device. The output from the basic inverter stage is coupled to the gate of the depletion mode device, and the gate of the enhancement mode device in the output stage is connected to the logic input to the basic inverter stage. For a given power dissipation, the improved circuit has increased switching performance, particularly at higher supply voltages. However, the increased switching performance is achieved at the expense of flexibility of circuit design and the requirement for additional area on the chip.

In accordance with another aspect of the invention, an additional enhancement mode device may be connected between the depletion mode transistor used as the load and the output of the inverter stage to provide an on-off switching capability for output current. As mentioned, NOR and NAND gates may also be formed by providing additional enhancement mode devices between the output of the inverter stage and the source voltage.

The basic circuit of the invention is also highly useful as a linear amplifier having unusually high gain.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

FIG. 1 is a schematic circuit diagram of an inverter switching circuit in accordance with the present invention;

FIGS. 1*a* and 1*b* are schematic circuit diagrams of additional inverting logic gates in accordance with the present invention;

All specific embodiments herein described in detail utilize field effect transistors fabricated by diffusing spaced, p-type source and drain regions into an n-type substrate, forming an insulating gate such as silicon dioxide over the channel region between the source and drain regions, and then forming a conductive gate electrode over the channel region. Such a device is inherently an enhancement mode p-channel transistor. Assuming that the source region of such a device is at $V_{SS}$, typically ground potential, and that the drain region is biased to a negative voltage, the device will conduct whenever the gate to source voltage $V_{GS}$ is more negative than the threshold voltage $V_T$ of the device, where $V_T$ is always a negative value. When the magnitude of $V_{GS}$ is less than $V_T$, no significant conduction will occur.

The circuits of the present invention also utilize p-channel, depletion mode MOS transistors which have the same configuration, but have a p-channel between the diffused regions produced by ion implantation, as will hereafter be described in greater detail. As a result, the depletion mode devices conduct whenever the gate to source voltage $V_{GS}$ is more negative than the pinch-off voltage $V_P$ of the device, where $V_P$ is always positive. In order to stop conduction, the gate voltage with respect to the source voltage must be more positive than the pinch-off voltage. Thus, if the gate is at the same potential as the source, the device nevertheless continues to conduct.

Although all circuits are herein described as using p-channel transistors, it is to be understood that the present invention is equally applicable to n-channel transistors. The n-channel enhancement mode and depletion mode devices function in the same manner as p-channel enhancement and depletion mode devices, except that the polarity of the voltages is reversed. Accordingly, as used herein, the term low voltage refers to the source or substrate voltage which is shown as ground potential, and the term high voltage refers to the drain voltage, which is a negative voltage for p-channel devices, and a positive voltage for n-channel devices. In some instances it will also be convenient to refer to the higher or drain voltage levels as logic "1" levels, which for p-channel devices would typically be from −5.0 volts to −17.0 volts, and for n-channel devices would typically be +5.0 volts to +17 volts, and to the source, substrate, ground or lower voltage levels as the logic "0" levels.

Figure 1:
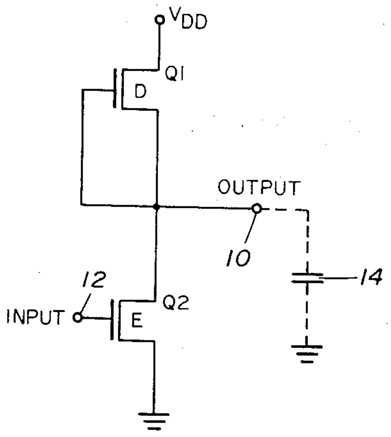

Referring now to the drawings, the basic inverter circuit of the present invention is shown in FIG. 1. Transistors Q1 and Q2 are connected in series between a drain voltage $V_{DD}$ and a source voltage, indicated by the conventional symbol for ground potential. The substrate of the integrated circuit is typically at ground potential. As mentioned, the drain voltage $V_{DD}$ would typically be from −5.0 volts to −17.0 volts for p-channel devices. The source of transistor Q1 and the drain of transistor Q2 are typically a common diffused region which is the output 10 for the circuit. Transistor Q1 is a depletion mode device, as indicated by the symbol "D" and transistor Q2 is an enhancement mode device as indicated by the symbol "E." The source of the depletion device Q1 is electrically common with the gate. The gate of the enhancement mode device Q2 forms the input 12 to the inverter stage. The output 10 is typically coupled to drive another circuit formed on the chip and always has some stray capacitance represented by the capacitor 14. In most instances, the output 10 will drive a circuit that is open to D.C. current, although for some applications a resistive element may also be driven in parallel to the stray capacitance 14. In rare instances, the capacitance 14 may be purposely increased to achieve a desired function within the circuit.

In operation, the depletion mode transistor Q1 is always turned on by gate to source voltage equal to the pinch-off voltage and, therefore, is operating substantially in the constant current condition. When the input 12 is at a logic "0" level, or any potential less than the threshold voltage $V_T$, transistor Q2 will be turned off and the output 10 will be substantially at $V_{DD}$, assuming that only the capacitance 14 is connected to the output. When the input 12 is at a logic "1" level, or any voltage level significantly exceeding the threshold voltage of transistor Q2, transistor Q2 conducts current in proportion to the term $(V_{GS}-V_T)^2$. As a result, the voltage level on output 10 moves toward the substrate potential, the ultimate level being a function of the conductance of transistors Q1 and Q2 under the particular operating conditions.

Since the depletion transistor Q1 is always turned on, even when transistor Q2 is turned off, the output 10 will go all the way to $V_{DD}$, assuming that the output is an open circuit to direct current. This provides a very strong logic "1" level for operating additional circuitry within the chip. In addition, it should be noted that the transistor Q1 operates either in or near the constant current mode at all times. Since the source and gate of transistor Q1 are electrically common, the same transistor is always turned on by the same voltage, the pinch-off voltage, and the current through transistor Q1 remains substantially constant until the output voltage approaches within one pinch-off of the drain supply voltage. This results in a substantially linear switching curve, as represented by transition 36 in FIG. 3. Since the current flow does not decrease as the output approaches the logic "1" level, the output can be switched from a logic "0" level to a logic "1" level in a substantially shorter period of time than an enhancement mode device having its gate connected to the drain voltage $V_{DD}$.

Figure 1A:
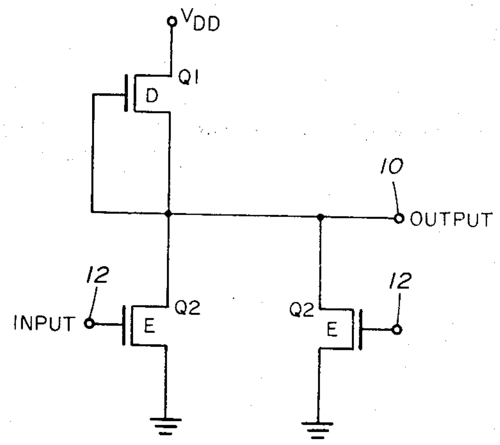
Figure 1B:
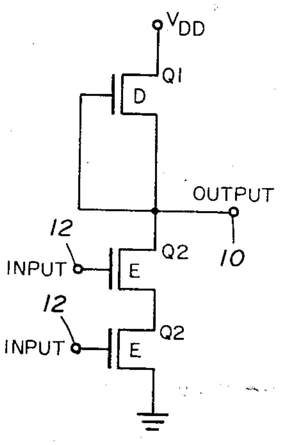

It will be evident to those skilled in the art that the basic inverter circuit of FIG. 1 can be used to form any inverting logic gate. For example, a NOR gate may be formed by connecting one or more enhancement mode transistors Q2 in parallel between the output 10 and the source voltage, as illustrated in FIG. 1*a*. A NAND gate may be formed by connecting one or more enhancement mode transistors Q2 in series between the output 10 and the source voltage, as illustrated in FIG. 1b. If desired, a combination NOR-NAND gate can be formed by combinations of these.

Figure 2:
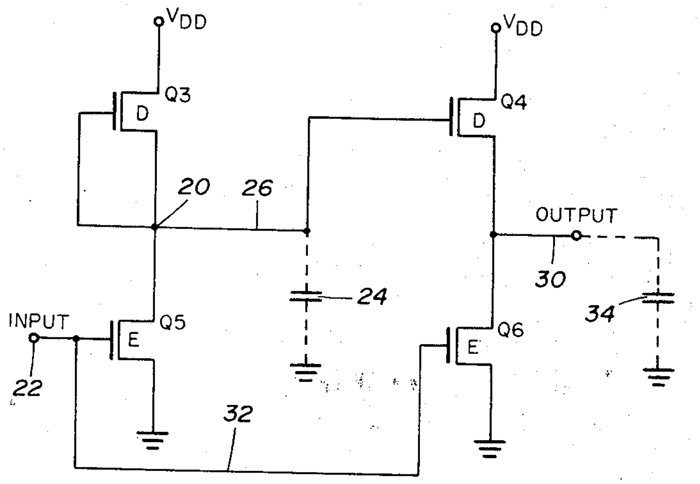
FIG. 2 is a schematic circuit diagram of another inverter switching circuit in accordance with the present invention.

The performance of the basic inverter circuit of FIG. 1 can be significantly enhanced, particularly when using higher drain voltages, by the circuit illustrated in FIG. 2. The circuit of FIG. 2 utilizes the basic inverter stage comprised of the depletion mode transistor Q3 and the enhancement mode transistor Q5. Again, additional enhancement mode transistors can be connected in parallel or in series with transistor Q5 to provide the desired logic gate functions. A second stage is formed by depletion mode transistor Q4 and enhancement mode transistor Q6. Although transistor Q4 is preferably a depletion mode transistor, it can be an enhancement mode transistor and still provide a significant improvement in performance. The output 20 of the basic inverter stage is connected by line 26 to the gate of transistor Q4. The stray capacitance of the line 26, including the gate of transistor Q4, is represented by capacitance 24. The input 22 is connected by line 32 to the gate of transistor Q6. The drain of transistor Q4 is connected to the drain supply voltage $V_{DD}$, the source of transistor Q4 and the drain of transistor Q6 are common and form the output 30 of the output stage, and the source of transistors Q6 is connected to the source supply voltage. The output 30 of the push-pull stage is normally connected to a line having a stray capacitance 34 which is substantially greater than the capacitance 24.

When the input 22 is at a logic "1" level, transistors Q5 and Q6 are turned on, and transistor Q6 pulls the output 30 down to a logic "0" level near ground. Transistor Q5 also pulls the output 20 of the input inverter stage down to a logic "0" level near ground. It should be noted that the gates of transistors Q3 and Q4 are nevertheless biased only to the pinch-off voltage levels, thus keeping the current through these devices substantially constant. When the input 22 goes to a logic "0" level, transistors Q5 and Q6 turn off. When transistor Q5 turns off, the current through transistor Q3 drives the output 20 to the drain supply voltage at a substantially constant rate. At the same time, transistor Q4 begins to drive the output 30 toward the drain supply voltage. However, since the capacitance 24 will customarily be much smaller than the capacitance 34, the output 20 will go negative, still assuming p-channel devices, at a much faster rate, assuming the same current levels. For example, if the gate of transistor Q4 were tied to the output 30, the rate at which the capacitor 34 would be charged might be represented by transition 18 in FIG. 3. The output 20 is represented by transition 36. It will be noted that the gate to source biased voltage on transistor Q4 is the difference between the voltages on outputs 20 and 30. As a result, transistor Q4 is turned on harder than it would be if its gate were connected to the output 30, and the additional current results in charging rate represented by transition 40.

When the input 22 transitions to a logic "1" level to turn transistors Q5 and Q6 on, the smaller capacitance 24 is again discharged more rapidly so that the output 20 moves toward the source voltage along the transition line 42, which is at a substantially greater rate than the rate at which current can be discharged from the larger capacitance 34. As a result, the gate of transistor Q4 is made more positive with respect to the source, tending to reduce the current through tansistor Q4, and permit transistor Q6 to pull the output 30 down at a greater rate, as represented by transistion 44, than would have been the case using the inverter of FIG. 1, the transition of which is represented at 45. At any point in time during the transition, the positive bias from gate to source of transistor Q4 is represented by the difference in transitions 42 and 44, as indicated at 46.

In order to more fully appreciate the difference in performance of the circuit of FIG. 1 and the circuit of FIG. 2, consider the following examples. assume that the circuit of FIG. 1 is biased by a drain supply voltage $V_{DD}$ of −5.0 volts and the source supply voltage is ground. Assume that the output 10 transistions beg-ween a logic "0" level of −1.0 volt and a logic "1" level of −5.0 volts. Assume also that capacitance 14 is 1.0 picofarad and that the geometry of transistor Q1 is chosen to conduct 10 microamperes of current. Under these conditions, the power supplied to the device is the product of the current and voltage, which is 50 microwatts. The time required to charge the capacitance 14 from −1.0 to −5.0 volts is approximately equal to the product of the capacitance and the voltage change of 4 volts, divided by the current, which is equal to 400 nanoseconds. In this computation, it will be noted that the current through transistor Q1 is assumed to be constant.

Now assume that the circuit of FIG. 2 is also biased by a drain supply voltage $V_{DD}$ of −5.0 volts, and the source supply voltage is ground, and that the output 30 swings from a logic "0" level of −1.0 volt to a logic "1" level of −5.0 volts. Assume that transistors Q3 and Q4 are half the size of transistor Q1 so that the current through each of the transistors is 5.0 microamps, thus giving the same total power consumption of 50 microwatts as the circuit of FIG. 1. Assume also that the capacitance 24 is 0.1 picofarads and that the capacitance 34 is 1.0 picofarad, the same as capacitance 14. The time required for output 20 to transition from the logic "0" level of −1.0 volt to a logic "1" level of −5.0 volts is again the product of the voltage change and the capacitance, divided by the current, which is 80 nanoseconds. Thus, it will be noted that output 20 at the first stage of the circuit of FIG. 2 goes to the logic "1" level in one-fifth the time required for output 10 of the circuit of FIG. 1. Assume that the average gate to source voltage on transistor Q4 during the transition period is one-half of the difference in the logic "1" and logic "0" levels, i.e., 2.0 volts, which is a slightly best-case assumption. Assume also that the pinch-off voltage of transistors Q1 and Q4 is 4.0 volts. Then the total turn-on voltage for transistor Q1 is 4.0 volts as compared to 6.0 volts for transistor Q4. The current through transistor Q4 is then proportional to the square of 6.0 volts, or 36 units of current. This compares with a total turn-on voltage of only 4.0 volts for transistor Q1, which provides 16 units of current. However, since transistor Q4 is only half the size of transistor Q1, the net result of transistor Q4 is to provide only 18 units of current. Thus, for a −5.0 volt drain supply voltage $V_{DD}$, the circuits of FIGS. 1 and 2 are quite similar in switching performance. However, consider the situation if the drain voltage $V_{DD}$ is −17.0 volts. In that case, the voltage tending to turn transistor Q1 on remains at 4.0 volts, continuing to give 16 units of current. However, the voltage biasing transistor Q4 is now the 4.0 volt pinch-off voltage, plus one-half of the voltage swing from −1.0 volts to −17.0 volts, the logic "1" level, giving a total bias of 12.0 volts. This results in 72 units of current through transistor Q4, considering the transitor Q4 is half the size of transitor Q1. As a result of the higher drain voltage, the circuit of FIG. 2 will switch the output from the logic "0" to the logic "1" level in less than one-fourth the time required for circuit of FIG. 1 when using the same higher drain voltage.

Figures 3, 4:
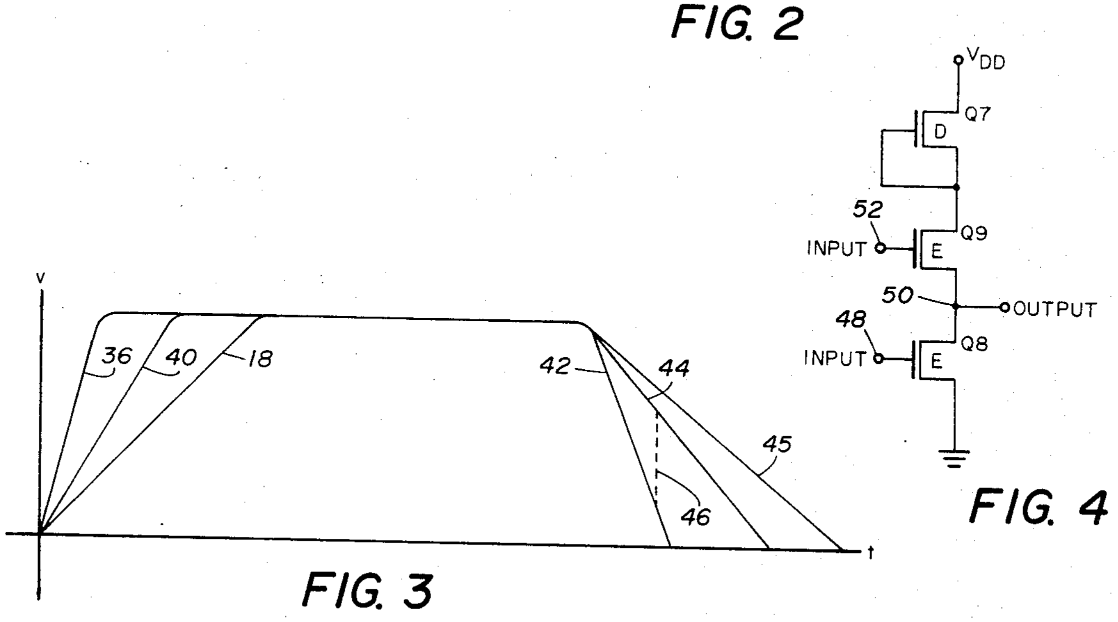
FIG. 3 is a graph of the voltage with respect to time at a number of nodes within the circuit shown in FIG. 2 during switching transitions.
FIG. 4 is a schematic circuit diagram of yet another switching circuit in accordance with the present invention.

FIG. 4 illustrates another embodiment of the inverter circuit of the present invention. The circuit of FIG. 4 includes a depletion mode transistor Q7 and enhancement mode transistors Q8 and Q9. The transistors Q7 and Q8 function precisely as transistors Q1 and Q2 in the circuit of FIG. 1 as heretofore described. The transistor Q9 is connected between the source of the depletion mode transistor Q7 and the output node 50, and provides a means for disabling current from output node 50. Thus, in order to obtain a logic "1" level on the output 50, a logic "1" level must be applied to the gate 52 of transistor Q9 so that transistor Q9 will be turned on. Of course, it will be appreciated that additional enhancement mode transistors can be connected either in series or in parallel with transistor Q9 in order to perform additional logic gate functions, as heretofore described in FIGS. 1*a* and 1*b*.

Although the circuit of FIG. 1 is particularly useful in MOSFET digital integrated circuits, which are of primary commercial importance at the present time, the circuit configuration of FIG. 1 is also an amplifier of exceptionally high gain and quality when biased and operated with the output signal in the midrange between the drain voltage supply $V_{DD}$ and the source voltage supply $V_{SS}$.

Figure 5:
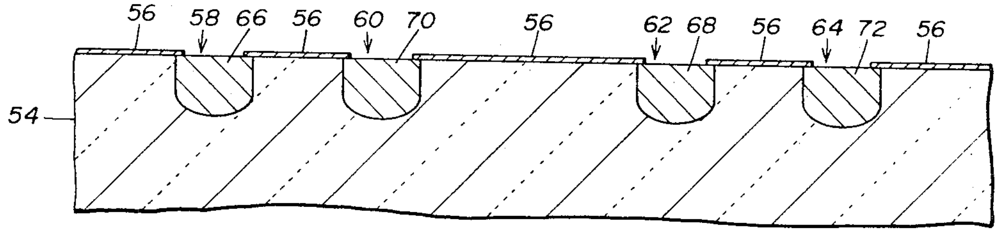
FIGS. 5–8 are schematic diagrams illustrating a process for fabricating the circuits of the present invention as LSI circuits.
Figure 6:
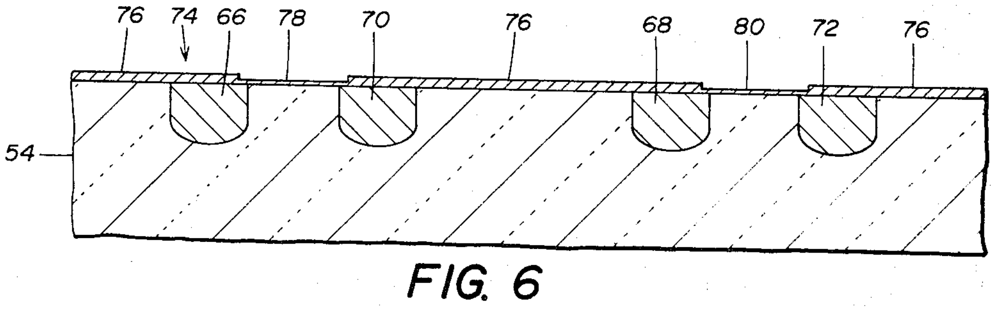
Figure 7:
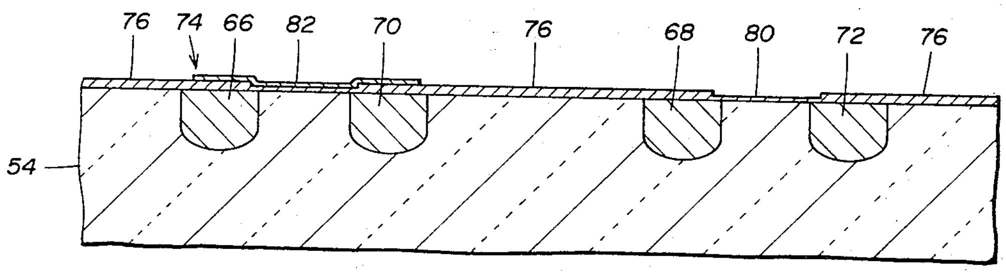
Figure 8:
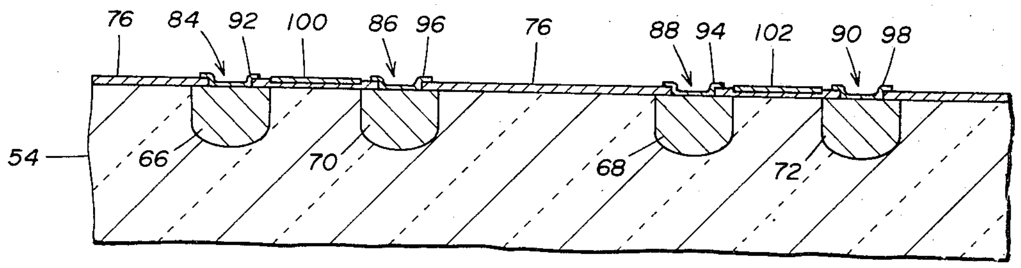

FIGS. 5–8 illustrate the steps of a double ion implantation process which may be used to fabricate the circuitry of the present invention. FIG. 5 shows a portion of an n-type silicon substrate 54 of a monolithic chip in which both enhancement mode and depletion mode p-channel FET devices are to be formed. A silicon dioxide layer 56 is deposited on substrate 54 by conventional thermal growth techniques and openings 58, 60, 62 and 64 made therethrough using conventional photoresist and selective etching techniques. P-type diffusions are then made through openings 58 and 62 to form p-type source regions 66 and 68, respectively, and through openings 60 and 64 to form p-type drain regions 70 and 72, respectively. Silicon dioxide layer 56 is then stripped from substrate 54 and a new silicon dioxide layer, generally indicated by numeral 74 and having thick regions 76 and thin regions 78 and 80 is formed on substrate 54. Thin regions 78 and 80 are disposed above the channel areas, between source and drain regions 66 and 70 and source and drain regions 68 and 72, respectively, of the FET devices. The substrate 54 as illustrated in FIG. 6 is subjected to an ion implantation process in which p-type dopants which have a preselected energy are implanted in the surface of substrate 54. The energy of the ions is arranged to permit the dopants to penetrate the thin regions 78 and 80, but is insufficient to permit the ions to penetrate thick regions 76. The dosage of the dopants thus implanted is controlled to reduce the threshold voltage of the FET devices being formed to a value suitable for enhancement mode devices.

After that ion implantation step, a thin shield 82 of metal or other material is placed over thin portion 78 which is disposed above the channel region of the device which is to be an enhancement mode device. Substrate 54 is then subjected to another ion implantation step and additional ions are implanted below thin region 80 of layer 74. The dosage of ions implanted is sufficient to convert the channel disposed below thin region 80 to a p-type layer, thereby providing a depletion mode device. The shield 82 is removed from thin portion 78 and openings 84, 86, 88 and 90 cut through thick portions 76, over regions 66, 70, 68 and 72, respectively. Finally, a metalized layer is deposited over silicon dioxide layer 74 and patterned to form source contacts 92 and 94 above regions 66 and 68, respectively, drain contacts 96 and 98 above regions 70 and 72, respectively, and the metalized gates 100 and 102 above thin portions 78 and 80 of layer 74.

Although preferred embodiments of the invention have been described in detail, it is to be understood that various changes, substitutions, and alterations can be made therein without departing from the spirit and scope of the invention as defined by the appended claims.

What is claimed is:

1. The integrated circuit including the inverter gate comprising:

a depletion mode field effect transistor coupling a drain voltage to an output node, the gate of the depletion mode field effect transistor being connected to the output node, at least one enhancement mode field effect transistor coupling the output node to a source voltage, the gate of the enhancement mode transistor being the input, and at least one enhancement mode field effect transistor coupling the source of the depletion mode field effect transistor to the output node, the gate of said last mentioned enhancement mode field effect transistor being a logic input for enabling the inverter gate.

2. The integrated circuit of claim 1 wherein all field effect transistors are p-channel devices.

3. The integrated circuit of claim 1 wherein all field effect transistors are n-channel devices.

4. The integrated circuit including the inverter circuit comprising:

a first depletion mode field effect transistor coupling a drain voltage to a first output node, the gate of the first depletion mode field effect transistor being connected to the first output node, a first enhancement mode field effect transistor coupling the first output node to a source voltage, the gate of the first enhancement mode field effect transistor being connected to an input terminal, a second depletion mode field effect transistor coupling a drain voltage to a second output node, the gate of the second depletion mode field effect transistor being connected to the first output node, and a second enhancement mode field effect transistor coupling the second output node to a source voltage, the gate of the second enhancement mode field effect transistor being connected to the gate of the first enhancement mode field effect transistor.

5. The integrated circuit of claim 4 wherein the field effect transistors are p-channel devices.

6. The integrated circuit of claim 4 wherein the field effect transistors are n-channel devices.

* * * * *

UNITED STATES PATENT AND TRADEMARK OFFICE

CERTIFICATE OF CORRECTION

PATENT NO. : 3,775,693

DATED : November 27, 1973

INVENTOR(S) : Robert J. Proebsting

It is certified that error appears in the above-identified patent and that said Letters Patent are hereby corrected as shown below:

In Claim 1, at:

Column 8, line 47, delete "to an output node";
Column 8, line 49, change "output node" to --source--;
Column 8, line 51, change the first "the" to --an--.

Signed and Sealed this

***Twelfth* Day of *June 1979***

[SEAL]

*Attest:*

RUTH C. MASON
*Attesting Officer*

DONALD W. BANNER
*Commissioner of Patents and Trademarks*